United States Patent
Deng et al.

(10) Patent No.: US 7,415,055 B2
(45) Date of Patent: *Aug. 19, 2008

(54) RELIABILITY-ENHANCING LAYERS FOR VERTICAL CAVITY SURFACE EMITTING LASERS

(75) Inventors: Qing Deng, San Jose, CA (US); John Herniman, Santa Rosa, CA (US)

(73) Assignee: Avago Technologies Fiber IP Pte Ltd, Singapore (SG)

( * ) Notice: Subject to any disclaimer, the term of this patent is extended or adjusted under 35 U.S.C. 154(b) by 340 days.

This patent is subject to a terminal disclaimer.

(21) Appl. No.: 10/619,521

(22) Filed: Jul. 14, 2003

(65) Prior Publication Data

US 2005/0175050 A1    Aug. 11, 2005

(51) Int. Cl.
*H01S 5/00* (2006.01)
(52) U.S. Cl. .................. 372/45.011; 372/46.013; 372/50.11
(58) Field of Classification Search .............. 372/45, 372/46, 48, 54, 45.011, 46.013, 50.11
See application file for complete search history.

(56) References Cited

U.S. PATENT DOCUMENTS

| | | | |
|---|---|---|---|
| 4,984,242 A | | 1/1991 | Scifres et al. |
| 5,337,327 A | | 8/1994 | Ackley |
| 5,359,618 A | | 10/1994 | Lebby et al. |
| 5,493,577 A | * | 2/1996 | Choquette et al. ...... 372/46.013 |
| 5,719,892 A | | 2/1998 | Jiang |
| 5,724,374 A | | 3/1998 | Jewell |
| 5,835,521 A | * | 11/1998 | Ramdani et al. ............ 372/96 |
| 5,838,705 A | * | 11/1998 | Shieh et al. ............ 372/45.01 |
| 5,896,408 A | | 4/1999 | Corzine et al. |
| 5,978,408 A | | 11/1999 | Thornton |
| 5,985,686 A | | 11/1999 | Jayaraman |

(Continued)

FOREIGN PATENT DOCUMENTS

DE    10217304    10/2002

(Continued)

OTHER PUBLICATIONS

Karim, A., Black, Abraham P., etal. "Super Lattice Barrier 1528-nm Vertical-Cavity Laser with 85 'C Continuous-Waver Operation." IEEE Photonics Technology Letters, vol. 12, No. 11 Nov. 2000 pp. 1438-1440.

*Primary Examiner*—Minsun Oh Harvey
*Assistant Examiner*—Tod T. Van Roy

(57) ABSTRACT

Vertical cavity surface emitting lasers (VCSELs) and methods of making the same are described. The VCSELs include reliability-enhancing layers that perform specific functions at one or more critical locations within a VCSEL structure to reduce or prevent defect formation and migration that otherwise might degrade VCSEL performance, for example, by increasing optical absorption in the mirror stacks or by degrading the electro-optic properties of the active region. In particular, the reliability-enhancing layers are configured to perform one or more of the following functions within the VCSEL structure: gettering (i.e., removing defects or impurities from critical regions), strain balancing (i.e., compensating the lattice mismatch in the structure to minimize strain), and defect suppression (i.e., creating alloys that reduce the formation of defects during growth or post-growth activities). By strategically positioning one or more appropriately configured reliability-enhancing layers with respect to an identified defect source, the invention enables VCSEL structures to be modified in a way that enhances the reliability and performance of VCSEL devices.

20 Claims, 3 Drawing Sheets

U.S. PATENT DOCUMENTS

| | | | |
|---|---|---|---|
| 5,991,321 A * | 11/1999 | Duggan | 372/45 |
| 5,991,326 A * | 11/1999 | Yuen et al. | 372/96 |
| 6,014,395 A | 1/2000 | Jewell | |
| 6,269,109 B1 * | 7/2001 | Jewell | 372/50.1 |
| 6,628,694 B2 * | 9/2003 | Deng et al. | 372/96 |
| 2002/0150137 A1 * | 10/2002 | Beam et al. | 372/49 |

FOREIGN PATENT DOCUMENTS

| | | |
|---|---|---|
| EP | 0860913 | 8/1996 |
| EP | 0772266 | 5/1997 |
| GB | 2380606 | 4/2003 |
| WO | WO 00/36719 | 6/2000 |
| WO | WO 00/38287 | 6/2000 |
| WO | WO 02/37630 | 5/2002 |

* cited by examiner

RELIABILITY-ENHANCING LAYERS FOR VERTICAL CAVITY SURFACE EMITTING LASERS

TECHNICAL FIELD

This invention relates to reliability-enhancing layers for vertical cavity surface emitting lasers, and methods of making the same.

BACKGROUND

A vertical cavity surface emitting laser (VCSEL) is a laser device formed from an optically active semiconductor layer (e.g., AlInGaAs or InGaAsP) that is sandwiched between a pair of highly reflective mirror stacks, which may be formed from layers of metallic material, dielectric material or epitaxially-grown semiconductor material. Typically, one of the mirror stacks is made less reflective than the other so that a portion of the coherent light that builds in a resonating cavity formed between the mirror stacks may be emitted from the device. Typically, a VCSEL emits laser light from the top or bottom surface of the resonating cavity with a relatively small beam divergence. VCSELs may be arranged in singlets, one-dimensional or two-dimensional arrays, tested on wafer, and incorporated easily into an optical transceiver module and coupled to a fiber optic cable.

In general, a VCSEL may be characterized as a gain-guided VCSEL or an index-guided VCSEL. An implant VCSEL is the most common commercially available gain-guided VCSEL. An implant VCSEL includes one or more high resistance implant regions for current confinement and parasitic reduction. An oxide VCSEL, on the other hand, is the most common index-guided (laterally and vertically) VCSEL. An oxide VCSEL includes oxide layers (and possibly implant regions) for both current and optical confinement.

VCSELs and VCSEL arrays have been successfully developed for single-mode operation and multi-mode operation at a variety of different wavelengths (e.g., 650 nm, 850 nm, 980 nm, 1300 nm and 1550 nm). The commercial success of VCSEL technology, however, will depend in large part upon development of VCSEL structures that are characterized by high performance and high reliability.

Techniques have been proposed for improving the performance and reliability of a wide variety of different semiconductor laser devices, including VCSELs and edge-emitting lasers.

For example, U.S. Pat. No. 5,838,705 discloses VCSEL devices (i.e., a non-planar ridge VCSEL and a planar implant VCSEL) that include one or more defect inhibition layers that are positioned in a respective one of two cladding regions that are formed on opposite sides of an active area. According to the '705 patent, the defect inhibition layers may be disposed anywhere outside of the active area. However, the only preferred locations for the defect inhibition layers are in close proximity and on either side of the active area to provide a barrier that does not allow defects formed outside of the active area to pass through and into the active area. The defect inhibition layers are formed from an indium-containing material that induces strain in the VCSEL device. The strain is believed to either prohibit movement of defects to the active area or attract and, subsequently, trap defects in the defect inhibition layers.

U.S. Pat. No. 4,984,242 discloses a GaAs/AlGaAs edge-emitting laser that includes at least one cladding layer that includes indium. According to the '242 patent, the indium creates a local strain field that is sufficient to reduce and effectively stop defect migration through the cladding layer. The indium-containing strain layer may be spaced apart from the active region or may be positioned adjacent to the active region. Indium-containing layers may be added to the active region barrier layers to improve the performance of the edge-emitting laser. In one embodiment, a uniform doping of indium is provided throughout the edge-emitting laser heterostructure to impede the growth and migration of defects in the crystal lattice. Another embodiment includes indium in a cap layer to reduce the surface work function and, thereby, reduce the contact resistance of an overlying metallization layer. The '242 patent does not teach or suggest the use of indium in a VCSEL, nor does it teach or suggest how indium might be translated to a VCSEL structure.

SUMMARY

The invention features reliability-enhancing layers that perform specific functions at one or more critical locations within a VCSEL structure to reduce or prevent defect formation and migration that otherwise might degrade VCSEL performance, for example, by increasing optical absorption in the mirror stacks or by degrading the electro-optic properties of the active region. In particular, the reliability-enhancing layers are configured to perform one or more of the following functions within the VCSEL structure: gettering (i.e., removing defects or impurities from critical regions), strain balancing (i.e., compensating the lattice mismatch in the structure to minimize strain), and defect suppression (i.e., block/reduce defects formation/migration during growth, processing or device operations). By strategically positioning one or more appropriately configured reliability-enhancing layers with respect to an identified defect source, the invention enables VCSEL structures to be modified in a way that enhances the reliability and performance of VCSEL devices.

In one aspect, the invention features a vertical cavity surface emitting laser (VCSEL) that includes a first mirror stack, a second mirror stack, and a cavity region that is disposed between the first mirror stack and the second mirror stack and includes an active region. The VCSEL also includes a defect source and a reliability-enhancing layer positioned with respect to the defect source to reduce defect-induced degradation of one or more VCSEL regions.

Embodiments in accordance with this aspect of the invention may include one or more of the following features.

The reliability-enhancing layer may be positioned between the defect source and the cavity region, within the defect source, or in close proximity to the defect source (above or below, or both).

As used herein, the term "cavity region" refers to the VCSEL structure that includes the active region and the spacer layers.

The reliability-enhancing layer may include one or more of the following elements: indium, boron, phosphorus, antimony, and nitrogen. The reliability-enhancing layer may be lattice-matched to surrounding layers. Alternatively, the reliability-enhancing layer may include one or more strained layers. The reliability-enhancing layer may include a superlattice, which may be tensile strained, compressive strained or strain compensated. The reliability-enhancing layers may be separated by non-reliability-enhancing layers.

The defect source may include one or more of the following: an oxidized portion of the VCSEL, an implant region of the VCSEL, an exposed region of the VCSEL, one or more dielectric layers, a doped region of the VCSEL, and the substrate.

The reliability-enhancing layer may be configured to balance strain created by the defect source. For example, the defect source may include an oxide region that induces a compressive strain field, and the reliability-enhancing layer may be positioned within the compressive strain field and may be characterized by tensile strain that substantially balances the compressive strain field.

In some embodiments, the defect source creates a concentration gradient that induces defect migration. In these embodiments, the reliability-enhancing layer may be configured to reduce the induced defect migration. For example, the defect source may be characterized by a relatively high group V vacancy concentration, in which case, the reliability-enhancing layer preferably is characterized by a lower diffusion rate of vacancy defects.

In another aspect, the invention features a method of manufacturing a VCSEL. In accordance with this method, a first mirror stack is formed, a second mirror stack is formed, and a cavity region having an active region is formed therebetween. A defect source is formed, and a reliability-enhancing layer is positioned with respect to the defect source to reduce defect-induced degradation of one or more VCSEL regions.

Other features and advantages of the invention will become apparent from the following description, including the drawings and the claims.

DETAILED DESCRIPTION

In the following description, like reference numbers are used to identify like elements. Furthermore, the drawings are intended to illustrate major features of exemplary embodiments in a diagrammatic manner. The drawings are not intended to depict every feature of actual embodiments nor relative dimensions of the depicted elements, and are not drawn to scale.

Figure 1:
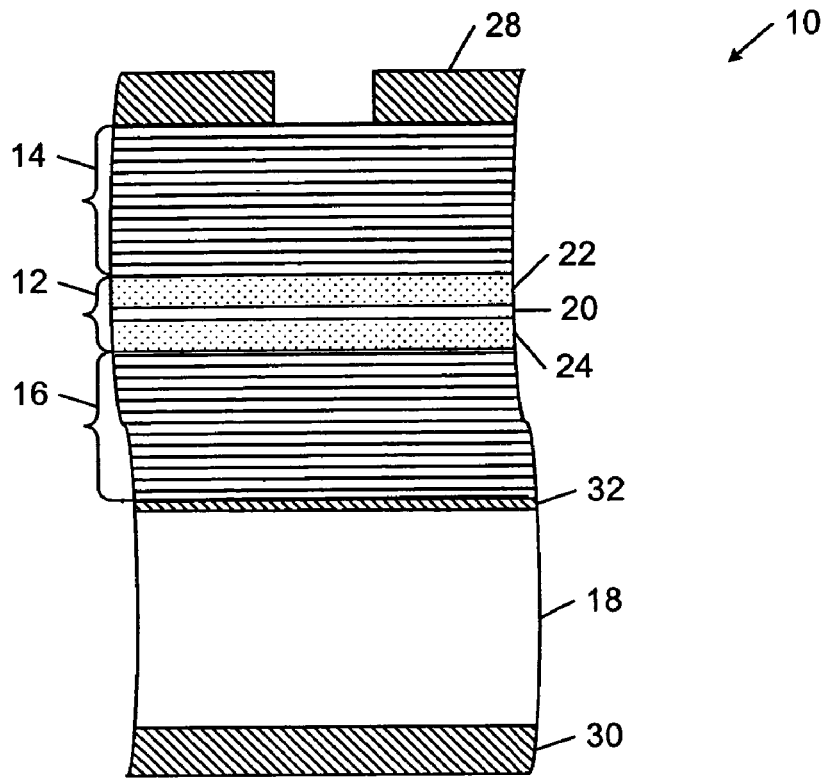
FIG. 1 is a diagrammatic cross-sectional side view of a portion of a VCSEL structure.

Referring to FIG. 1, in one generalized representation, a VCSEL 10 includes a cavity region 12 that is sandwiched between a first mirror stack 14 and a second mirror stack 16, which is formed on a substrate 18. Cavity region 12 includes one or more active layers 20 (e.g., a quantum well or one or more quantum dots) that are sandwiched between a pair of spacer layers 22, 24. In other embodiments, active layer 20 may be located above or below a single spacer layer. A pair of electrical contacts 28, 30 enable VCSEL 10 to be driven by a suitable driving circuit. In operation, an operating voltage is applied across electrical contacts 28, 30 to produce a current flow in VCSEL 10. In general, current flows through a central region of the VCSEL structure and lasing occurs in a central portion of cavity region 12 (hereinafter the "active region"). As shown in the embodiments described below, a confinement region (e.g., an oxide region or an implant region, or both) may provide lateral confinement of carriers and photons. Carrier confinement results from the relatively high electrical resistivity of the confinement region, which causes electrical current preferentially to flow through a centrally located region of VCSEL 10. In an oxide VCSEL, optical confinement results from a substantial reduction of the refractive index of the confinement region that creates a lateral refractive index profile that guides the photons that are generated in cavity region 12, whereas in an implant VCSEL optical confinement results primarily from thermal lensing and the injected carrier distribution. The carrier and optical lateral confinement increases the density of carriers and photons within the active region and, consequently, increases the efficiency with which light is generated within the active region. In some embodiments, the confinement region circumscribes a central region of VCSEL 10, which defines an aperture through which VCSEL current preferably flows. In other embodiments, oxide layers may be used as part of the distributed Bragg reflectors in the VCSEL structure.

Active layer 20 may be formed from AlInGaAs (i.e., AlInGaAs, GaAs, AlGaAs and InGaAs), InGaAsP (i.e., InGaAsP, GaAs, InGaAs, GaAsP, and GaP), GaAsSb (i.e., GaAsSb, GaAs, and GaSb), InGaAsN (i.e., InGaAsN, GaAs, InGaAs, GaAsN, and GaN), or AlInGaAsP (i.e., AlInGaAsP, AlInGaAs, AlGaAs, InGaAs, InGaAsP, GaAs, InGaAs, GaAsP, and GaP). Other quantum well layer compositions also may be used. First and second spacer layers 22, 24 may be formed from materials chosen based upon the material composition of the active layers. First and second mirror stacks 14, 16 each includes a system of alternating layers of different refractive index materials that forms a distributed Bragg reflector (DBR) designed for a desired operating laser wavelength (e.g., a wavelength in the range of 650 nm to 1650 nm). For example, first and second mirror stacks 14, 16 may be formed of alternating layers of high aluminum content AlGaAs and low aluminum content AlGaAs. The layers of first and second mirror stacks 14, 16 preferably have an effective optical thickness (i.e., the layer thickness multiplied by the refractive index of the layer) that is about one-quarter of the operating laser wavelength. Substrate 18 may be formed from GaAs, InP, sapphire ($Al_2O_3$), or InGaAs and may be undoped, doped n-type (e.g., with Si) or doped p-type (e.g., with Zn). A buffer layer 32 may be grown on substrate 18 before VCSEL 10 is formed. In the illustrative representation of FIG. 1, first and second mirror stacks 14, 16 are designed so that laser light is emitted from the top surface of VCSEL 10; in other embodiments, the mirror stacks may be designed so that laser light is emitted from the bottom surface of substrate 18.

VCSEL 10 may be formed by conventional epitaxial growth processes, such as metal-organic chemical vapor deposition (MOCVD) and molecular beam epitaxy (MBE). VCSEL 10 may include a mesa structure that is formed by etching down at least to the confinement region of VCSEL 10. The mesa structure may be etched by conventional wet or dry etching processes, including reactive ion etching (RIE) and reactive ion beam etching (RIBE).

As explained above, it has been observed that certain defect sources (e.g., an oxide region, an implant region, etched holes, etched trenches, etched mesas, substrate 18, dielectric layers, and highly doped regions) tend to introduce strain, stress or defects (e.g., interfacial voids or point defects, or both) that may degrade the performance of VCSEL 10. The following VCSEL embodiments feature reliability-enhancing layers that may be positioned at one or more critical locations within the VCSEL structure to reduce defect-induced degradation of the active region or other VCSEL regions (e.g., mirror stacks 14, 16), or both. In particular, reliability-enhancing layers may be positioned between the active region and the defect source, within the defect source, or in close proximity to the defect source (above or below, or both). The reliability-enhancing layers may include one or more of the following elements: In, P, B, N, and Sb. These elements may be incorporated into thick layers that are lattice matched to surrounding layers, thin strained layers, and superlattice structures that may be tensile strained, compressive strained or unstrained. Exemplary reliability-enhancing layers include GaAsP, InGaAsP, AlInGaAsP, AlGaAsSb, InGaAs, InAlGaAs, InGaAsP, and $Ga_xB_{1-x}N$. The reliability-enhancing layers may be incorporated into one or more of the constituent layers of a VCSEL, including active layers, cavity layers, DBR mirror stacks, oxide layers, cap layers, and buffer layers. The reliability-enhancing layers may be separated by non-reliability-enhancing layers. A reliability-enhancing layer may be used to balance the strain fields induced by a defect source. For example, compressive strain that is induced by an oxide layer may be balanced by positioning a tensile strained reliability-enhancing layer (e.g., a GaAsP layer) in a region encompassed by the compressive strain fields of the oxide layer. A reliability-enhancing layer also may be positioned adjacent to or within a defect source to getter (or trap) defects. In addition, a reliability-enhancing layer may be used to block or reduce migration of defects or dopants. In particular, with respect to a defect source that creates a concentration gradient that induces defect migration, a reliability-enhancing layer may be configured to reduce the induced defect migration. For example, when a defect source creates a group V vacancy gradient, group VI dopant diffusion may be enhanced. In this case, a reliability-enhancing layer that is characterized by a low group V vacancy concentration may be positioned within the VCSEL structure to reduce or block the group VI dopant (or other point defect) migration.

Figure 2A:
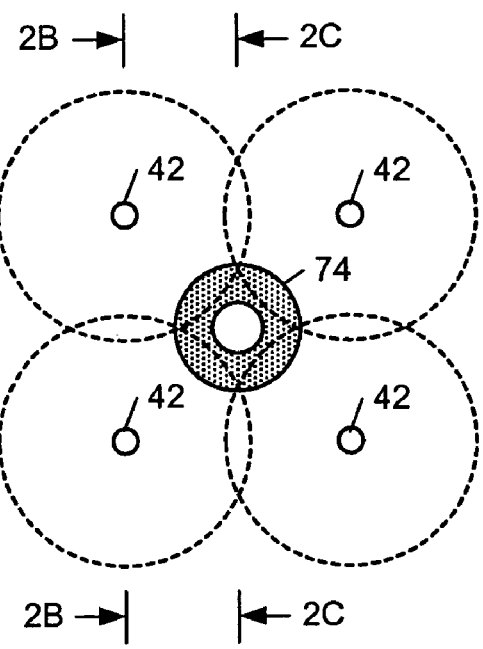
FIG. 2A diagrammatic top view of a planar oxide VCSEL with a reliability-enhancing layer positioned between an oxidized portion of a first mirror stack and a cavity region.
Figure 2B:
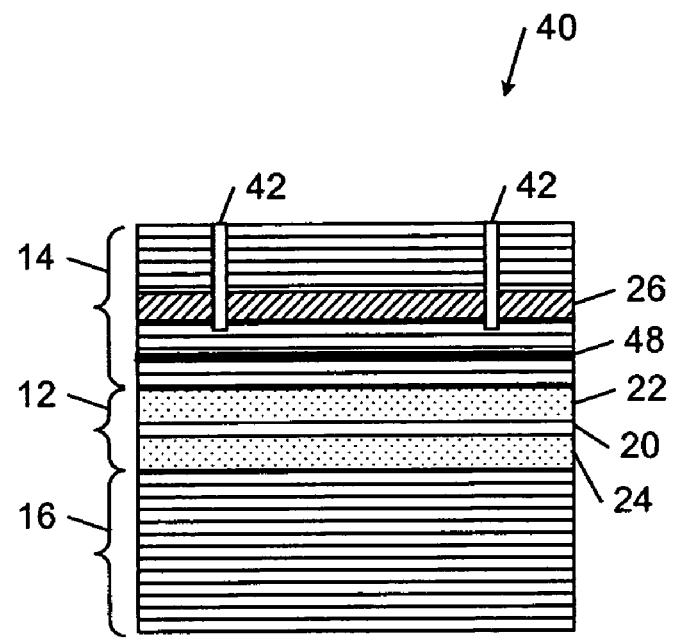
FIG. 2B is a diagrammatic cross-sectional side view of the planar oxide VCSEL of FIG. 2A taken along the line 2B-2B.
Figure 2C:
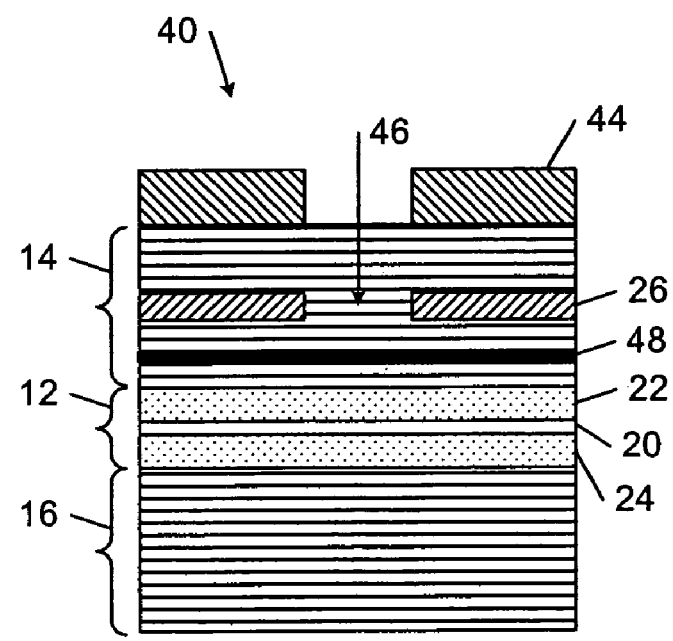
FIG. 2C is a diagrammatic cross-sectional side view of the planar oxide VCSEL of FIG. 2A taken along the line 2C-2C.

Referring to FIGS. 2A-2C, in one embodiment, a planar index-guided oxide VCSEL 40 includes a cavity region 12 sandwiched between a first mirror stack 14 and a second mirror stack 16, which is formed on a substrate 18. Cavity region 12 includes one or more active layers 20 (e.g., a quantum well or one or more quantum dots) that are sandwiched between a pair of spacer layers 22, 24. As shown, in this embodiment, VCSEL 40 has a planar structure that includes a number of holes 42 that expose a number of respective side regions of first mirror stack 14 to be oxidized. At least a portion 26 of first mirror stack 14 is oxidized from the exposed side regions inwardly toward a centrally located aperture region 46. In this embodiment, four holes 42 are opened that are equidistant from the center of a first electrode 44. Holes 42 extend from the first surface of VCSEL 40 down at least to the layer (or layers) corresponding to oxidized portion 26. When the VCSEL structure is exposed to heated water vapor, the heated water vapor enters holes 26 and oxidizes portion 26 in a radial direction away from holes 42. The oxidation process continues until the oxidation front from each hole 42 merges to form an un-oxidized aperture 46. Other oxide VCSEL embodiments may include more or fewer exposure holes 42 or exposed regions with other shapes, such as trenches or arches.

It has been observed that lateral oxidation of VCSEL 40 generates strain or stress in the VCSEL structure that may introduce defects (e.g., interfacial voids or point defects, or both) that tend to migrate into the active region or other VCSEL regions over time (e.g., during subsequent processing steps and during VCSEL operation) and, consequently, may compromise the reliability of VCSEL 40. In the embodiment of FIGS. 2A-2C, a reliability-enhancing layer 48 is disposed between oxidized portion 26 of first mirror stack 14 and cavity region 12. As explained below, in other embodiments, reliability-enhancing layers may be positioned within oxidized portion 26 or in close proximity to oxidized portion 26 (above or below, or both). Reliability-enhancing layer 48 preferably is selected to produce between oxidized portion 26 of first mirror stack 14 and cavity region 12 a localized strain field that substantially reduces defect migration through reliability-enhancing layer 48 and, thereby, protects cavity region 12 from defect-induced degradation. In the embodiment of FIGS. 2A-2C, reliability-enhancing layer 48 may be formed from a semiconductor alloy formed from Al, Ga, As and one or more of the following elements: In, B, P, Sb and N. For example, reliability-enhancing layer 48 may be formed from InGaAs, InAlGaAs, InGaAsP, or GaAsP. Reliability-enhancing layer 48 may be formed by adding one or more of, e.g., In, B, P, Sb and N during the epitaxial growth of one or more of the constituent layers of first mirror stack 14 that are located between oxidized portion 26 and cavity region 12.

In some embodiments, at least a portion of second mirror stack 16 may be oxidized from the exposure holes 42 inwardly toward a centrally located region to achieve additional lateral confinement of carriers and photons. In these embodiments, a reliability-enhancing layer may be disposed between the oxidized portion of second mirror stack 16 and cavity region 12. This reliability-enhancing layer preferably is selected to produce between the oxidized portion of second mirror stack 16 and cavity region 12 a localized strain field that substantially reduces defect migration through the reliability-enhancing layer and, thereby, protects cavity region 12 from defect-induced degradation. In these embodiments, the reliability-enhancing layer may have the same structure as reliability-enhancing layer 48. As explained below, in other embodiments, reliability-enhancing layers may be positioned within the oxidized portion of second mirror stack 16 or in close proximity to the oxidized portion of second mirror stack 16 (above or below, or both).

For example, other embodiments may include reliability-enhancing layers that are designed to balance the strain that is introduced by the lateral oxidation of first mirror stack 14 or second mirror stack 16, or both. In one embodiment, a reliability-enhancing layer may be positioned adjacent to (e.g., above or below, or both) the oxidized portions of first mirror stack 14 or second mirror stack 16, or both. In another embodiment, a reliability-enhancing layer may be positioned within the oxidized portions of first mirror stack 14 or second mirror stack 16, or both. In another embodiment, the oxidized portions of first mirror stack 14 or second mirror stack 16, or both, may be sandwiched between respective pairs of reliability-enhancing layers. In these embodiments, the compressive strain created by the oxidation of portions of first mirror stack 14 or second mirror stack 16, or both, may be balanced substantially by a reliability-enhancing layer that introduces a compensating tensile strain into the mirror stack. For example, in an embodiment that includes AlGaAs mirror stacks, the reliability-enhancing layers may be formed from $In_1Ga_{1-x}P$, where x<0.5 tensile. In these embodiments, the reliability-enhancing layers may suppress the formation of defects as well as block the migration of defects into cavity region 12 and other regions of the VCSEL structure.

In some embodiments, first mirror stack 14 may be implanted up to or through oxide layer 26 to further improve the performance of VCSEL 10. In these embodiments, one or more reliability-enhancing layers may be formed above or within the implantation region to getter defects, or between the implantation region and cavity region 12 to suppress the propagation of defects into cavity region 12.

Figure 3:
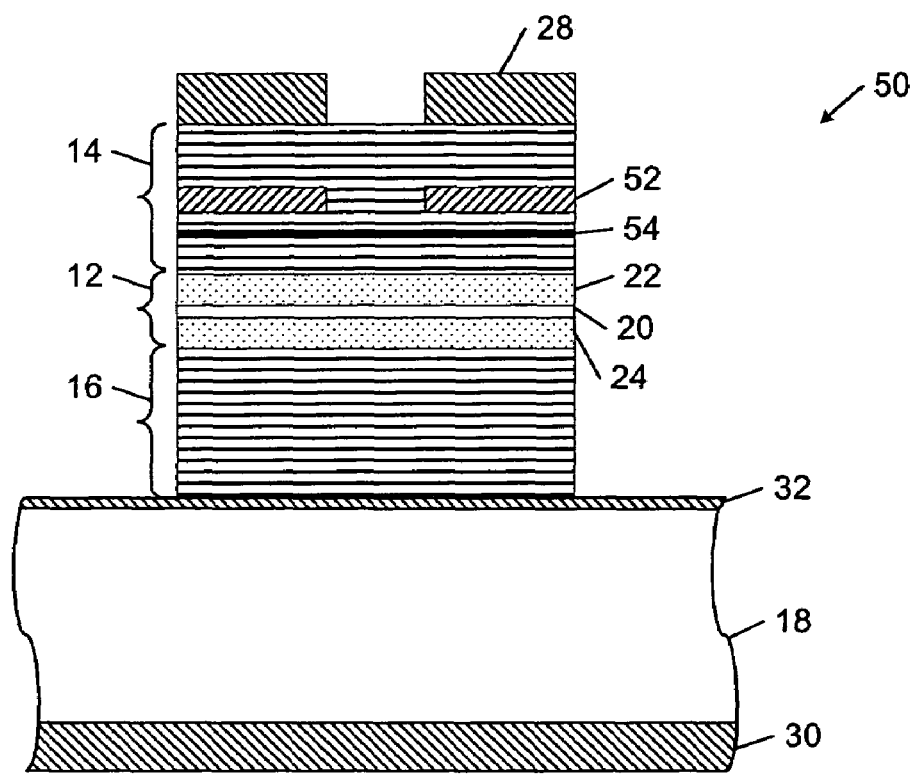
FIG. 3 is a diagrammatic cross-sectional side view of an index-guided oxide VCSEL with a reliability-enhancing layer positioned between an oxidized portion of a first mirror stack and an active region.

Referring to FIG. 3, in another embodiment, a non-planar index-guided oxide VCSEL 50 is formed into a mesa (or pillar) structure with exposed sidewalls. At least a portion 52 of first mirror stack 14 is oxidized from the exposed mesa sidewalls inwardly toward a centrally located aperture region. As explained above, lateral oxidation of VCSEL 50 induces strain or stress in the VCSEL structure that may introduce defects (e.g., interfacial voids or point defects, or both) that tend to migrate into the active region over time (e.g., during subsequent processing steps and during VCSEL operation) and, consequently, may compromise the reliability of VCSEL 50. In this embodiment, a reliability-enhancing layer 54 is disposed between oxidized portion 52 of first mirror stack 14 and cavity region 12. In some embodiments, at least a portion of second mirror stack 16 may be oxidized from the exposed sidewalls inwardly toward a centrally located region to achieve additional lateral confinement of carriers and photons. In these embodiments, a reliability-enhancing layer may be disposed between the oxidized portion of second mirror stack 16 and cavity region 12. Other embodiments may include reliability-enhancing layers that are designed to balance the strain that is introduced by the lateral oxidation of first mirror stack 14 or second mirror stack 16, or both, as described above in connection with the embodiment of FIGS. 2A-2C. In these embodiments, reliability-enhancing layers may be positioned within the oxidized portion of the first mirror stack or the oxidized portion of the second mirror stack, or both, or in close proximity to (above or below, or both) the oxidized portion of the first mirror stack or the oxidized portion of the second mirror stack, or both.

Figure 4:
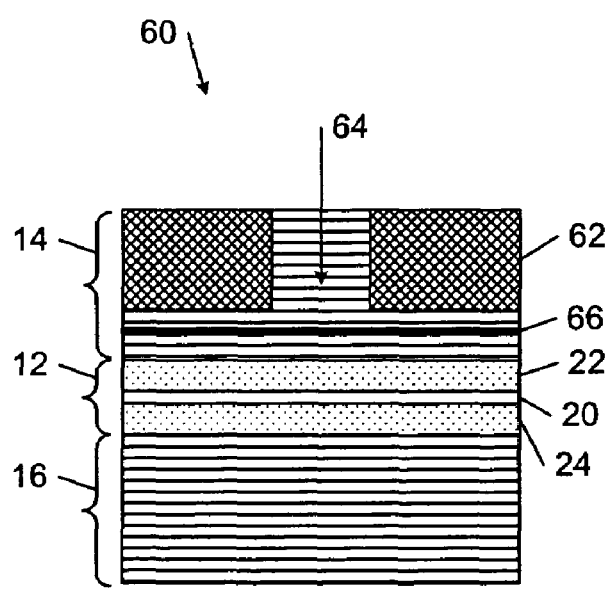
FIG. 4 is a diagrammatic cross-sectional side view of a gain-guided implant VCSEL with a reliability-enhancing layer positioned between an implant region of a first mirror stack and an active region.

Referring to FIG. 4, in one embodiment, a gain-guided implant VCSEL 60 includes a cavity region 12 sandwiched between a first mirror stack 14 and a second mirror stack 16, which is formed on a substrate 18. Cavity region 12 includes one or more active layers 20 (e.g., a quantum well or one or more quantum dots) that are sandwiched between a pair of spacer layers 22, 24. As shown in this embodiment, VCSEL 60 includes an implant region 62 that defines an aperture region 64. It has been observed that implant region 62 of VCSEL 60, especially at the implantation front, generates point defects that tend to migrate into the cavity region over time (e.g., during subsequent processing steps and during VCSEL operation) and, consequently, may compromise the reliability of VCSEL 60.

In the embodiment of FIG. 4, a reliability-enhancing layer 66 is disposed between implant region 62 and cavity region 12. In other embodiments, reliability-enhancing layers may be positioned within implant region 62 or in close proximity to implant region 62 (above or below, or both). Reliability-enhancing layer 66 is selected to produce a localized strain field and/or change the defect equilibria between implant region 62 and cavity region 12 that substantially reduces defect migration through reliability-enhancing layer 66 and, thereby, protects cavity region 12 from defect-induced degradation. In the embodiment of FIG. 4, reliability-enhancing layer 66 may be formed from a semiconductor alloy formed from Al, Ga, As and one or more of the following elements: In, B, P, Sb and N. For example, reliability-enhancing layer 66 may be formed from InGaAs, InAlGaAs, InGaAsP, or GaAsP. Reliability-enhancing layer 66 may be formed by adding one or more of, e.g., In, B, P, Sb and N during the epitaxial growth of one or more of the constituent layers of first mirror stack 14 located between implant region 62 and cavity region 12.

In some embodiments, at least a portion of second mirror stack 16 may be implanted to achieve additional lateral confinement of carriers and photons. In these embodiments, a reliability-enhancing layer may be disposed between the implant region of second mirror stack 16 and cavity region 12. This reliability-enhancing layer preferably is selected to produce between the implant region of second mirror stack 16 and cavity region 12 a localized strain field that substantially reduces defect migration through the reliability-enhancing layer and, thereby, protects cavity region 12 from defect-induced degradation. In these embodiments, the reliability-enhancing layer may have the same structure as reliability-enhancing layer 66. In other embodiments, reliability-enhancing layers may be positioned within the implant region of second mirror stack 16 or in close proximity to the implant region of second mirror stack 16 (above or below, or both).

Other implant VCSEL embodiments may include reliability-enhancing layers that are designed to prevent degradation of active layer 20 and other VCSEL regions by defects that might be created during the implantation of first mirror stack 14 or second mirror stack 16, or both. For example, in one embodiment, a reliability-enhancing layer may be positioned adjacent to (e.g., above or below, or both) the implant regions of first mirror stack 14 or second mirror stack 16, or both. In another embodiment, a reliability-enhancing layer may be positioned within the implant regions of first mirror stack 14 or second mirror stack 16, or both. In another embodiment, the implant regions of first mirror stack 14 or second mirror stack 16, or both, may be sandwiched between respective pairs of reliability-enhancing layers. In such embodiments, the reliability-enhancing layers may modify strain fields, getter defects (e.g., point defects), suppress the formation of defects, and block the migration of defects into cavity region 12 and other regions of the VCSEL structure.

In each of the above-described embodiments, first mirror stack 14 preferably is doped with a dopant that has the opposite polarity as the substrate 18 (e.g., p-type dopants C or Mg for an n-type substrate 18). Second mirror stack 16 preferably is doped with a dopant that has the same polarity as the substrate 18 (e.g., n-type dopant Si for an n-type substrate 18). It has been observed that the process of doping the first and second mirror stacks 14, 16 also may introduce into the VCSEL structure defects that tend to migrate into critical VCSEL regions (e.g., the cavity region, which includes the active layers and the spacer layers) over time (e.g., during subsequent processing steps and during VCSEL operation). Accordingly, some embodiments may include reliability-enhancing layers that are disposed between the doped regions and the cavity region, within the doped regions, or in close proximity to the doped regions (above or below, or both). The reliability-enhancing layers preferably are selected to produce localized strain fields that substantially reduce defect migration therethrough and, thereby, protect cavity region 12 from defect-induced degradation. Each of the reliability-enhancing layers may be formed from a semiconductor alloy formed from Al, Ga, As and one or more of the following elements: In, B, P, Sb and N. For example, the reliability-enhancing layers may be formed from InGaAs, InAlGaAs, InGaAsP, or GaAsP. The reliability-enhancing layers may be formed by adding one or more of, e.g., In, B, P, Sb and N during the epitaxial growth of one or more of the constituent layers of first and second mirror stacks 14, 16 that are located between the doping regions and cavity region 12.

Semiconductor substrates—especially semi-insulating semiconductor substrates—are potential sources of defects that might migrate into critical VCSEL regions (e.g., the cavity region, which includes the active layers and the spacer layers) over time. For this reason, some embodiments may include a defect-migration-suppressing reliability-enhancing layer that is positioned between the active region and the substrate or in close proximity to the substrate. In some embodiments, the reliability-enhancing layer may be positioned within second mirror stack 16. The reliability-enhancing layer may be formed from semiconductor alloys formed from Al, Ga, As and one or more of the following elements: In, B, P, Sb and N. For example, the reliability-enhancing layer may be formed from InGaAs, InAlGaAs, InGaAsP, or GaAsP. The reliability-enhancing layer may be formed by adding one or more of, e.g., In, B, P, Sb and N during the epitaxial growth of one or more of the constituent layers of second mirror stack 16.

In some embodiments, one or more reliability-enhancing layers may be positioned in buffer layer 32 to getter defects or buffer defect formation, or both.

Other embodiments are within the scope of the claims.

For example, although the above embodiments are described in connection with AlGaAs mirror stack systems, other semiconductor alloy compositions or dielectric layers may be used to form the DBR mirror structures. In addition, the reliability-enhancing layers may be formed from single layers, as described above, or from superlattice structures (e.g., strained layer superlattices or strain-compensated superlattices).

Still other embodiments are within the scope of the claims.

What is claimed is:

1. A vertical cavity surface emitting laser (VCSEL), comprising:
   a first minor stack;
   a second mirror stack;
   a cavity region disposed between the first mirror stack and the second mirror stack, wherein the first mirror stack, the cavity region, and the second mirror stack are arranged along a vertical direction, and the cavity region includes an active region, a first side facing the first mirror stack, and a second side facing the second mirror stack;
   a defect source located such that only one of the first and second sides of the cavity region faces the defect source; and
   a reliability-enhancing layer positioned within the defect source and producing a localized strain field within the defect source to reduce migration of defects in the vertical direction from the defect source to the active region, whereby the reliability-enhancing layer reduces defect-induced degradation of the active region by the defect source.

2. The VCSEL of claim 1, wherein the defect source comprises an implant region.

3. A vertical cavity surface emitting laser (VCSEL), comprising:
   a first mirror stack;
   a second mirror stack;
   a cavity region disposed between the first mirror stack and the second mirror stack and including an active region;
   a defect source;
   a first reliability-enhancing layer positioned with respect to the defect source and producing a localized strain field to reduce defect-induced degradation of the active region by the defect source, wherein the defect source is disposed between the reliability-enhancing layer and the cavity region; and
   a second reliability-enhancing layer positioned with respect to the defect source and producing a localized strain field that reduces defect-induced degradation of the active region by the defect source, wherein the second reliability-enhancing layer is separated from the first reliability-enhancing layer by one or more other layers and the first and second reliability-enhancing layers are located on opposite sides of the defect source.

4. A vertical cavity surface emitting laser (VCSEL), comprising:
   a first mirror stack:
   a second mirror stack;
   a cavity region disposed between the first mirror stack and the second mirror stack and including an active region;
   a strained defect source that creates a first strain field; and
   a strained reliability-enhancing layer positioned with respect to the defect source to reduce defect-induced degradation of one or more VCSEL regions, wherein the reliability-enhancing layer creates a second strain field that at least in part balances the first strain field created by the defect source.

5. The VCSEL of claim 4, wherein the reliability-enhancing layer is adjacent the defect source.

6. A vertical cavity surface emitting laser (VCSEL), comprising:
   a first mirror stack;
   a second mirror stack;
   a cavity region disposed between the first mirror stack and the second mirror stack and including an active region;
   a defect source, wherein the defect source includes an oxide region inducing a compressive strain field; and
   a reliability-enhancing layer positioned with respect to the defect source to reduce defect-induced degradation of one or more VCSEL regions, wherein the reliability-enhancing layer is configured to at least in part balance strain created by the defect source, and the reliability-enhancing layer is positioned within the compressive strain field and is characterized by tensile strain.

7. A vertical cavity surface emitting laser (VCSEL), comprising:
   a first mirror stack;
   a second mirror stack;
   a cavity region disposed between the first mirror stack and the second mirror stack and including an active region;
   a defect source; and
   a reliability-enhancing layer positioned with respect to the defect source to reduce defect-induced degradation of one or more VCSEL regions, wherein the reliability-enhancing layer is configured to at least in part balance strain created by the defect source;
   wherein at least one of the first and second mirror stacks comprises oxidized AlGaAs layers, the defect source corresponds to at least one of the oxidized AlGaAs layers, and the reliability-enhancing layer is formed from $In_xGa_{1-x}P$, wherein x<0.5 tensile.

8. A vertical cavity surface emitting laser (VCSEL), comprising:
   a first mirror stack;
   a second mirror stack;
   a cavity region disposed between the first mirror stack and the second mirror stack and including an active region;

a defect source; and a reliability-enhancing layer positioned with respect to the defect source to reduce defect-induced degradation of one or more VCSEL regions, wherein the defect source creates a concentration gradient inducing defect migration, and the reliability-enhancing layer introduces strain that reduces the induced defect migration.

9. The VCSEL of claim 8, wherein the defect source creates a Group V element vacancy gradient, and the reliability-enhancing layer has a Group V element vacancy concentration selected to block defect migration from the defect source to the active region.

10. A method of manufacturing a vertical cavity surface emitting laser (VCSEL), comprising:
forming a first mirror stack, a second mirror stack, and a cavity region disposed therebetween, wherein the first mirror stack, the cavity region, and the second mirror stack are arranged along a vertical direction, and the cavity region includes an active region, a first side facing the first mirror stack, and a second side facing the second mirror stack;
forming a defect source located such that only one of the first and second sides of the cavity region faces the defect source; and
forming a reliability-enhancing layer, wherein the reliability-enhancing layer is positioned within the defect source and produces a localized strain field within the defect source that reduces migration of defects in the vertical direction from the defect source to the active region, whereby the reliability-enhancing layer reduces defect-induced degradation of the active region by the defect source.

11. The method of claim 10, wherein the defect source comprises an implant region.

12. A method of manufacturing a vertical cavity surface emitting laser (VCSEL), comprising:
forming a first mirror stack, a second mirror stack, and a cavity region disposed therebetween, wherein the cavity region includes an active region;
forming a defect source;
forming a first reliability-enhancing layer producing a localized strain field positioned with respect to the defect source to reduce defect-induced degradation of the active region by the defect source, wherein the defect source is disposed between the reliability-enhancing layer and the cavity region; and
forming a second reliability-enhancing layer producing a localized strain field positioned with respect to the defect source to reduce defect-induced degradation of the active region by the defect source, wherein the second reliability-enhancing layer is separated from the first reliability-enhancing layer by one or more other layers and the first and second reliability-enhancing layers are located on opposite sides of the defect source.

13. A method of manufacturing a vertical cavity surface emitting laser (VCSEL), comprising:
forming a first mirror stack, a second mirror stack, and a cavity region disposed therebetween, wherein the cavity region includes an active region;
forming a strained defect source that creates a first strain field; and
forming a strained reliability-enhancing layer positioned with respect to the defect source to reduce defect-induced degradation of one or more VCSEL regions, wherein the reliability-enhancing layer creates a second strain field that at least in part balances the first strain field created by the defect source.

14. The method of claim 13, wherein the reliability-enhancing layer is adjacent the defect source.

15. A method of manufacturing a vertical cavity surface emitting laser (VCSEL), comprising:
forming a first mirror stack, a second mirror stack, and a cavity region disposed therebetween, wherein the cavity region includes an active region;
forming a defect source, wherein the defect source includes an oxide region inducing a compressive strain field; and
forming a reliability-enhancing layer positioned with respect to the defect source to reduce defect-induced degradation of one or more VCSEL regions, wherein the reliability-enhancing layer is configured to at least in part balance strain created by the defect source, and the reliability-enhancing layer is positioned within the compressive strain field and is characterized by tensile strain.

16. A method of manufacturing a vertical cavity surface emitting laser (VCSEL), comprising:
forming a first mirror stack, a second mirror stack, and a cavity region disposed therebetween, wherein the cavity region includes an active region, wherein at least one of the first and second mirror stacks comprises oxidized AlGaAs layers;
forming a defect source, wherein the defect source corresponds to at least one of the oxidized AlGaAs layers; and
forming a reliability-enhancing layer positioned with respect to the defect source to reduce defect-induced degradation of one or more VCSEL regions, wherein the reliability-enhancing layer is configured to at least in part balance strain created by the defect source, and the reliability-enhancing layer is formed from $In_xGa_{1-x}P$, wherein x<0.5 tensile.

17. A method of manufacturing a vertical cavity surface emitting laser (VCSEL), comprising:
forming a first mirror stack, a second mirror stack, and a cavity region disposed therebetween, wherein the cavity region includes an active region;
forming a defect source; and
forming a reliability-enhancing layer positioned with respect to the defect source to reduce defect-induced degradation of one or more VCSEL regions, wherein the defect source creates a concentration gradient inducing defect migration, and the reliability-enhancing layer introduces strain that reduces the induced defect migration.

18. The method of claim 17, wherein the defect source creates a Group V element vacancy gradient, and the reliability-enhancing layer has a Group V element vacancy concentration selected to block defect migration from the defect source to the active region.

19. A vertical cavity surface emitting laser (VCSEL), comprising:
a first mirror stack;
a second mirror stack;
a cavity region disposed between the first mirror stack and the second mirror stack and including an active region;
a defect source; and
a reliability-enhancing layer positioned with respect to the defect source to reduce defect-induced degradation of one or more VCSEL regions, wherein the reliability-enhancing layer is within the defect source and is configured to at least in part balance strain created by the defect source.

20. A method of manufacturing a vertical cavity surface emitting laser (VCSEL), comprising:

forming a first mirror stack, a second mirror stack, and a cavity region disposed therebetween, wherein the cavity region includes an active region;

forming a defect source; and forming a reliability-enhancing layer positioned with respect to the defect source to reduce defect-induced degradation of one or more VCSEL regions, wherein the reliability-enhancing layer is within the defect source and is configured to at least in part balance strain created by the defect source.

* * * * *